(12) United States Patent
Tang et al.

(10) Patent No.: US 12,426,328 B2
(45) Date of Patent: Sep. 23, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Yi Tang, Hefei (CN); Jianfeng Xiao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 533 days.

(21) Appl. No.: 17/933,139

(22) Filed: Sep. 19, 2022

(65) Prior Publication Data

US 2024/0038846 A1 Feb. 1, 2024

Related U.S. Application Data

(63) Continuation of application No. PCT/CN2022/110982, filed on Aug. 8, 2022.

(30) Foreign Application Priority Data

Jul. 28, 2022 (CN) .......................... 202210899449.0

(51) Int. Cl.
*H10D 62/17* (2025.01)
*H01L 21/265* (2006.01)
(Continued)

(52) U.S. Cl.
CPC ..... *H10D 62/299* (2025.01); *H01L 21/26513* (2013.01); *H10D 84/017* (2025.01); *H10D 84/038* (2025.01); *H10D 62/105* (2025.01)

(58) Field of Classification Search
CPC .. H10D 62/299; H10D 84/017; H10D 84/038; H10D 62/105; H10D 30/025;
(Continued)

(56) References Cited

U.S. PATENT DOCUMENTS 4,941,026 A * 7/1990 Temple ................ H10D 64/513
257/370
5,323,040 A * 6/1994 Baliga ................. H10D 62/151
257/334
(Continued)

FOREIGN PATENT DOCUMENTS

CN 113644061 A 11/2021
CN 114078779 A 2/2022
(Continued)

OTHER PUBLICATIONS

International Search Report cited in PCT/CN2022/110982 mailed Apr. 13, 2023, 8 pages.
(Continued)

*Primary Examiner* — Caleen O Sullivan
(74) *Attorney, Agent, or Firm* — Kilpatrick Townsend & Stockton LLP

(57) ABSTRACT

Embodiments of the present disclosure relate to the field of semiconductors, and provide a semiconductor structure and a manufacturing method thereof. The semiconductor structure includes: an active pillar, where the active pillar includes: a channel region, as well as a first doped region and a second doped region located at two sides of the channel region, the channel region, the first doped region, and the second doped region having a same doping type, where a counter-doped region is arranged in the channel region, the counter-doped region is close to the first doped region, and a doping type of the counter-doped region is different from a doping type of the channel region; and a gate, where the gate surrounds a part of the channel region, and in a plane in which an axis of the active pillar is located, projection of the gate partially overlaps with projection of the counter-doped region.

12 Claims, 2 Drawing Sheets

(51) Int. Cl.
  *H10D 62/10* (2025.01)
  *H10D 84/01* (2025.01)
  *H10D 84/03* (2025.01)

(58) Field of Classification Search
  CPC .. H10D 30/43; H10D 30/635; H10D 30/6728; H10D 30/6735; H10D 62/307; H10D 62/314; H10D 30/601; H01L 21/26513
  USPC .................................. 257/213, 192, 162, 27
  See application file for complete search history.

(56) References Cited

U.S. PATENT DOCUMENTS

| | | |
|---|---|---|
| 5,581,100 A | 12/1996 | Ajit |
| 9,385,195 B1 | 7/2016 | Zhang |
| 2010/0276662 A1 | 11/2010 | Colinge |
| 2021/0391330 A1 | 12/2021 | Zhu et al. |

FOREIGN PATENT DOCUMENTS

| | | |
|---|---|---|
| CN | 114420644 A | 4/2022 |
| CN | 114759030 A | 7/2022 |

OTHER PUBLICATIONS

European Patent Office, Extended European Search Report Issued in Application No. 22782647.6, Apr. 2, 2024, Germany, 13 pages.
Sahay Shubham et al: "Controlling L-BTBT and Volume Depletion in Nanowire JLFETs Using Core-Shell Architecture", IEEE Transactions on Electron Devices, IEEE, USA, vol. 63, No. 9, Sep. 1, 2016.

* cited by examiner

SEMICONDUCTOR STRUCTURE AND MANUFACTURING METHOD THEREOF

CROSS-REFERENCE TO RELATED APPLICATIONS

This is a continuation of International Application No. PCT/CN2022/110982, filed on Aug. 8, 2022, which claims the priority to Chinese Patent Application No. 202210899449.0, titled "SEMICONDUCTOR STRUCTURE AND MANUFACTURING METHOD THEREOF" and filed on Jul. 28, 2022. The entire contents of International Application No. PCT/CN2022/110982 and Chinese Patent Application No. 202210899449.0 are incorporated herein by reference.

TECHNICAL FIELD

Embodiments of the present disclosure relate to the technical field of semiconductors, and in particular to a semiconductor structure and a manufacturing method thereof.

BACKGROUND

Leakage currents that cause static power consumption in a transistor device mainly include: a sub-threshold leakage current from the source to the drain, a gate leakage current, or a gate-induced drain leakage (GIDL) current that occurs in the overlap between the gate and the drain. Among these leakage currents, the GIDL current is the dominating leakage current when the transistor device is in an off state or in a wait state. Therefore, the GIDL current has become one of the major factors affecting the reliability and power consumption of a small-size transistor device.

In order to reduce the contact resistance between a contact structure and a conductive structure, the drain of the transistor device inevitably has an overlapping area with the gate during a doping process, which is likely to generate a high GIDL current, thus increasing the leakage current. When a high gate-drain voltage occurs in the gate-drain overlapping area, electrons in the substrate near the interface of the gate-drain overlapping area undergo band-to-band tunneling (BTBT) between a valence band and a conduction band to generate a current, which is called GIDL tunneling current. The GIDL tunneling current increases sharply as a gate dielectric layer becomes thinner, and the GIDL tunneling current has a great impact on the reliability of the transistor device.

As the process enters the ultra-deep submicron era, many reliability issues caused by the GIDL current have become more serious due to the shrinking size of transistor devices. Therefore, a method for reducing the GIDL current is needed to effectively reduce the GIDL current while controlling the lateral spread of the drain and the impact on device characteristics.

SUMMARY

According to some embodiments of the present disclosure, an aspect of the embodiments of the present disclosure provides a semiconductor structure, including: a base, where the base includes an active region having a contact region; a semiconductor layer and a conductive layer that are laminated, where the semiconductor layer is located in the contact region, a band gap width of a material of the semiconductor layer is less than a band gap width of a material of the active region; and a contact plug, located on a surface of the conductive layer.

According to some embodiments of the present disclosure, an aspect of the embodiments of the present disclosure provides a semiconductor structure, including: an active pillar, where the active pillar includes: a channel region, as well as a first doped region and a second doped region located at two sides of the channel region, the channel region, the first doped region, and the second doped region having a same doping type, where a counter-doped region is arranged in the channel region, the counter-doped region is close to the first doped region, and a doping type of the counter-doped region is different from a doping type of the channel region; and a gate, where the gate surrounds a part of the channel region, and in a plane in which an axis of the active pillar is located, projection of the gate partially overlaps with projection of the counter-doped region.

According to some embodiments of the present disclosure, another aspect of the embodiments of the present disclosure provides a method of manufacturing a semiconductor structure, including: providing a base, where the base includes an active pillar, and the active pillar has a first doping type; forming a counter-doped region, where the counter-doped region is located in the active pillar and is close to an end of the active pillar, and a doping type of the counter-doped region is different from a doping type of the active pillar; forming a gate, where the gate surrounds partial surface of the active pillar, and in a plane in which an axis of the active pillar is located, projection of the gate partially overlaps with projection of the counter-doped region; and performing heavy ion doping of a first doping type on two end portions of the active pillar, to form a first doped region and a second doped region.

BRIEF DESCRIPTION OF THE DRAWINGS

One or more embodiments are described illustratively by use of corresponding drawings. The illustrative description does not constitute any limitation on the embodiments. Unless otherwise expressly specified, the drawings do not constitute a scale limitation. To describe the technical solutions in the embodiments of the present disclosure or in the prior art more clearly, the following outlines the drawings required in the embodiments of the present disclosure. Evidently, the drawings outlined below are merely some embodiments of the present disclosure. Those of ordinary skill in the art may derive other drawings from the outlined drawings without making any creative effort.

DETAILED DESCRIPTION

It is known from the background that there is a problem of GIDL current in the semiconductor structure.

It is found through analysis that the gate and drain regions in the transistor structure are theoretically strictly aligned, but in practice, during doping of the drain, an overlapping area between the drain and the gate is inevitable. For example, for an n-metal-oxide-semiconductor (NMOS) transistor, when a negative voltage is turned off and the gate has a negative voltage, a large electric field will be generated in an overlapping area between the gate and the drain, and a thin depletion zone will appear near the gate dielectric layer. Due to an avalanche multiplication effect and a band-to-band tunneling effect (electrons tunnel directly from the valence band in the P-type region to the conduction band in the N-type region) caused by the thin depletion zone and the high electric field, minority carriers are generated in the drain below the gate and are pushed into the substrate by the negative gate voltage, thus increasing the GIDL current.

An embodiment of the present disclosure provides a semiconductor structure, to alleviate the problem of GIDL current in the semiconductor structure, thereby improving the reliability of the semiconductor structure.

The embodiments of the present disclosure are described in detail below with reference to the accompanying drawings. Those skilled in the art should understand that many technical details are proposed in the embodiments of the present disclosure to make the present disclosure better understood. However, even without these technical details and various changes and modifications made based on the following embodiments, the technical solutions claimed in the present disclosure may still be realized.

Figure 1:
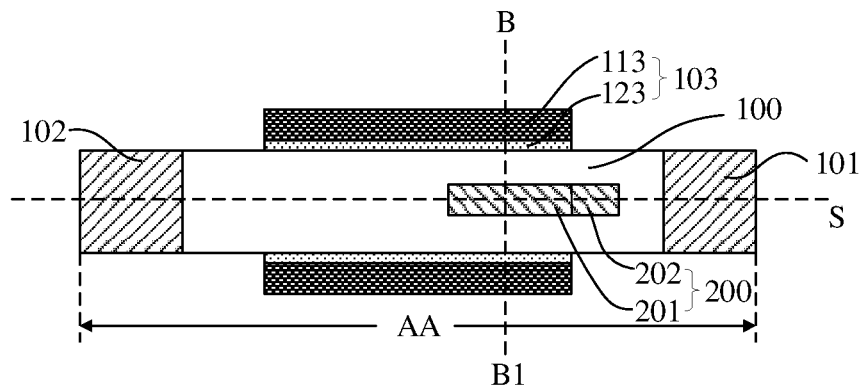
FIG. 1 is a schematic diagram of a semiconductor structure according to an embodiment of the present disclosure.
Figure 2:
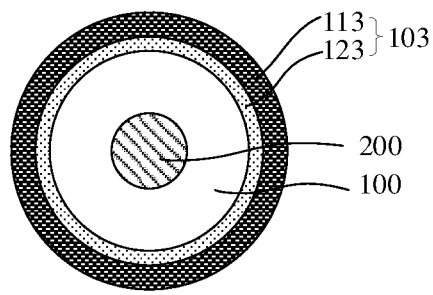
FIG. 2 is a schematic structural diagram of a cross section taken along direction BB1 in FIG. 1.
Figure 3:
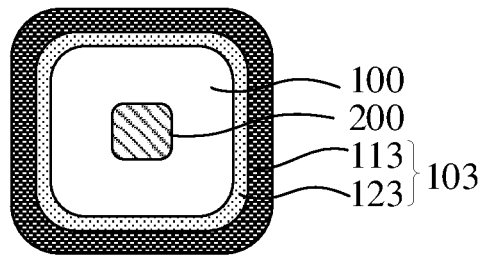
FIG. 3 is another schematic structural diagram of a cross section taken along direction BB1 in FIG. 1.

FIG. 1 is a schematic diagram of a semiconductor structure according to an embodiment of the present disclosure; FIG. 2 is a schematic structural diagram of a cross section taken along direction BB1 in FIG. 1; and FIG. 3 is another schematic structural diagram of a cross section taken along direction BB1 in FIG. 1. The semiconductor structure provided in this embodiment is described in detail below with reference to the accompanying drawings.

Referring to FIG. 1, a semiconductor structure includes: an active pillar AA, where the active pillar AA includes: a channel region 100, as well as a first doped region 101 and a second doped region 102 located at two sides of the channel region 100, the channel region 100, the first doped region 101, and the second doped region 102 having a same doping type, where a counter-doped region 200 is arranged in the channel region 100, the counter-doped region 200 is close to the first doped region 101, and a doping type of the counter-doped region 200 is different from that of the channel region 100; and a gate 103, where the gate 103 surrounds a part of the channel region 100, and in a plane in which an axis S of the active pillar AA is located, projection of the gate 103 partially overlaps with projection of the counter-doped region 200.

The active pillar AA formed by the channel region 100 as well as the first doped region 101 and the second doped region 102 at two sides of the channel region 100 may be configured to form a structure of a junctionless transistor. The first doped region 101 serves as one of the source or drain of the junctionless transistor, and the second doped region 102 serves as the other of the source or drain of the junctionless transistor. Compared with a junction transistor, the junctionless transistor can reduce the steepness of concentration gradient distribution between the channel region and the source or drain, thereby reducing thermal budget. The gate 103 surrounds a part of the channel region 100, to form a gate-all-around transistor; the area of the channel region is increased to enhance the current control capability of the transistor, thereby improving the usability of the semiconductor structure. Moreover, the gate-all-around structure can increase the space utilization of the semiconductor structure, thereby further increasing the integration density of the semiconductor structure. By arranging the counter-doped region 200 in the channel region 100, a PN junction can be formed in the channel region 100. The counter-doped region 200 extends towards the first doped region 101, to increase the distance between the gate 103 and the first doped region 101, such that no overlapping area appears between the first doped region 101 and the gate 103, thereby reducing the intensity of the electric field between the first doped region 101 and the gate 103. Moreover, the effective current width of the first doped region 101 is also reduced, to reduce the band-to-band tunneling current, thereby reducing the GIDL current between the first doped region 101 and the gate 103.

According to the following formula of the band-to-band tunneling (BTBT) current, when the effective width W reduces, that is, when a remaining width of the channel region 100 obtained by subtracting a cross-sectional width of the counter-doped region 200 from a cross-sectional width of the channel region 100 decreases, the corresponding band-to-band tunneling current decreases accordingly, thereby reducing the GIDL current.

$$J_{B2B} = \int \frac{qm^*_{DOS}kT}{2h^3} D \cdot W \cdot T_{pro} dE$$

where m*DOS denotes density-of-state effective mass; D denotes a factor determined by electron and hole concentrations; W denotes an effective width; Tpro denotes a tunneling probability; E denotes electron kinetic energy; h denotes a Planck's constant; q denotes charge; K denotes a Boltzmann's constant; and T denotes a temperature.

It should be noted that, in this embodiment, the first doped region 101 is used as the drain of the transistor, and the second doped region 102 is used as the source of the transistor. It should be noted that, the specific connection manner of the "source" and "drain" above does not limit the embodiment of the present disclosure. In other embodiments, a connection manner in which the "source" is replaced with the "drain", and the "drain" is replaced with the "source" may be used.

The active pillar AA includes: a channel region 100, a first doped region 101, and a second doped region 102, where the channel region 100, the first doped region 101 and the second doped region 102 have the same doping type. In some embodiments, the doping type of the channel region 100, the first doped region 101 and the second doped region 102 may be P-type or N-type. N-type dopant ions include phosphorus, arsenic, or antimony ions; and P-type dopant ions include boron, indium, or boron fluoride ions.

For the counter-doped region 200, a doping type of the counter-doped region 200 is different from that of the channel region 100. If the type of dopant ions of the channel region 100 is N-type, the type of dopant ions of the counter-doped region 200 is P-type; if the type of dopant ions of the channel region 100 is P-type, the type of dopant ions of the counter-doped region 200 is N-type.

In some embodiments, the channel region 100 has a doping concentration of $1E^{14}$ cm$^{-3}$ to $1E^{19}$ cm$^{-3}$. For example, the doping concentration of the channel region 100 may be $1E^{14}$ cm$^{-3}$, $1E^{15}$ cm$^{-3}$, $1E^{18}$ cm$^{-3}$ or $1E^{19}$ cm$^{-3}$. The first doped region 101 and the second doped region 102 have a doping concentration of $1E^{19}$ cm$^{-3}$ to $1E^{22}$ cm$^{-3}$. For example, the doping concentration of the first doped region 101 and the second doped region 102 may be $1E^{19}$ cm$^{-3}$, $1E^{20}$ cm$^{-3}$, $1E^{21}$ cm$^{-3}$ or $1E^{22}$ cm$^{-3}$. The counter-doped region 200 has a doping concentration of $1E^{17}$ cm$^{-3}$ to $1E^{19}$ cm$^{-3}$. For example, the doping concentration of the counter-doped region 200 may be 1E$^{17}$ cm$^{-3}$, 1E$^{18}$ cm$^{-3}$ or 1E$^{19}$ cm$^{-3}$.

The first doped region 101 and the second doped region 102 are heavily doped, and the channel region 100 is lightly doped, which can reduce the steepness of the concentration gradient distribution between the channel region 100 and the first doped region 101 as well as the second doped region 102, thereby reducing the thermal budget; by doping the counter-doped region with a medium concentration, a PN junction can be formed in the channel region 100, such that the GIDL current between the gate 103 and the first doped region 101 cannot pass through the counter-doped region 200, thereby reducing the GIDL current of the transistor in the off-state and improving the reliability of the semiconductor structure.

The gate 103 surrounds partial surface of the channel region 100, and in a plane in which an axis S of the active pillar AA is located, projection of the gate 103 partially overlaps with projection of the counter-doped region 200. In other words, the channel region 100 covered by the gate 103 includes a part of the counter-doped region 200, such that the counter-doped region 200 is formed as an obstacle on a path from the gate 103 to the first doped region 101, to reduce the GIDL current from the gate 103 to the first doped region 101.

Referring to FIG. 1, in some embodiments, the gate 103 includes a gate dielectric layer 123 and a gate conductive layer 113. The gate dielectric layer 123 covers and surrounds partial surface of the channel region 100, and the gate conductive layer 113 covers a surface of the gate dielectric layer 123, to prevent reaction between the gate conductive layer 113 and the active pillar AA in subsequent processes and avoid damaging the semiconductor structure.

The gate dielectric layer 123 is made of at least one from the group consisting of silicon oxide, silicon nitride, or silicon oxynitride.

The gate conductive layer 113 is made of at least one from the group consisting of polysilicon, titanium nitride, titanium aluminide, tantalum nitride, tantalum, copper, aluminum, lanthanum, copper or tungsten.

Further referring to FIG. 1, in this embodiment, the counter-doped region 200 includes a first inversion region 201 and a second inversion region 202 connected to each other. In the plane in which the axis S of the active pillar AA is located, projection of the first inversion region 201 is within the projection of the gate 103, and projection of the second inversion region 202 is adjacent to the projection of the gate 103. In other words, along the direction of the axis S of the active pillar AA, a part of the counter-doped region 200 in the length direction is located within the range of the channel region 100 covered by the gate 103, and the other part in the length direction is located in the channel region 100 between the gate 103 and the first doped region 101. It may be understood that, the GIDL current is a leakage current between the gate and the drain, that is, a leakage current between the gate 103 and the first doped region 101. When the counter-doped region 200 is located in the channel region 100 between the gate 103 and the first doped region 101, the counter-doped region 200 is equivalent to an obstacle on the path of the GIDL current to prevent the GIDL current from flowing through the counter-doped region 200, thereby reducing the GIDL current between the gate 103 and the first doped region 101 and improving the reliability of the semiconductor structure.

Further, in some embodiments, along the direction of the axis S of the active pillar AA, a length of the gate 103 is 60% to 80% of a length of the channel region 100, and a length of the first inversion region 201 is 20% to 60% of the length of the gate 103. It may be understood that, if there is an overlapping area between the gate 103 and the first doped region 101 or the second doped region 102, a large electric field will be generated, and a thin depletion zone will appear near the gate dielectric layer 123. The thin depletion zone and high electric field will cause an avalanche multiplication effect and a band-to-band tunneling effect, thus affecting the performance of the semiconductor structure. Therefore, in the direction of the axis S of the active pillar AA, the length of the gate 103 is 60% to 80% of the length of the channel region 100, which can avoid the overlapping area between the first doped region 101 or the second doped region 102 and the gate 103, thereby improving the reliability of the semiconductor structure. In the plane in which the axis S of the active pillar AA is located, the projection of the first inversion region 201 lies within the projection of the gate 103. The longer the length of the first inversion region 201 along the axis S of the active pillar AA, the larger the overlapping area with the projection of the gate 103, the smaller the region for the carriers to pass through during the actual use of the transistor, causing possible impact on the semiconductor structure. The shorter the length of the first inversion region 201 along the axis S of the active pillar AA, the smaller the impact on the carrier passage region during actual use, and the effect of obstructing the GIDL current is also reduced correspondingly, which may fail to reduce the GIDL current. Therefore, the length of the first inversion region 201 needs to be adjusted within a certain range according to actual conditions, to obstruct the GIDL current without affecting the usability of the semiconductor structure.

In some embodiments, along the direction of the axis S of the active pillar AA, the length of the second inversion region 202 is 20% to 60% of the distance between the gate 103 and the first doped region 101. It may be understood that, in the plane in which the axis S of the active pillar AA is located, the projection of the second inversion region 202 is adjacent to the projection of the gate 103. That is, the second inversion region 202 is located between the gate 103 and the first doped region 101, to reduce the GIDL current between the first doped region 101 and the gate 103, thereby improving the reliability of the semiconductor structure. If the second inversion region 202 is excessively long, it may be in contact with the first doped region 101 to damage the structure of the transistor, thus affecting the performance of the semiconductor structure. If the second inversion region 202 is excessively short, it may fail to obstruct the GIDL current, causing a decrease in the reliability of the semiconductor structure. Therefore, the length of the second inversion region 202 needs to be adjusted within a certain range according to actual conditions, to obstruct the GIDL current without affecting the usability of the semiconductor structure.

Referring to FIG. 2, in this embodiment, the active pillar AA is cylindrical, and a cross-sectional shape of the counter-doped region 200 is the same as a cross-sectional shape of the active pillar AA. In other embodiments, the active pillar AA may also be ellipsoidal or prismatic, and the cross-sectional shape of the counter-doped region 200 is the same as the cross-sectional shape of the active pillar AA. It may be understood that, referring to FIG. 2, the active pillar AA is cylindrical or ellipsoidal, such that the active pillar AA has a smoothly transitional shape, to avoid tip discharge or leakage in the working process of the transistor structure formed by active pillar AA. When the active pillar AA is prismatic, for example, referring to FIG. 3, when the cross-sectional shape of the active pillar AA is square, edges and corners of the active pillar AA may be chamfered such that transitions of the edges and corners of the active pillar AA are smooth. This can also avoid forming tips that lead to discharge or leakage.

It should be noted that, in this embodiment, an axis of the channel region coincides with an axis of the counter-doped region. In other embodiments, the axis of the channel region may be deviated from the axis of the counter-doped region, and an axis deviation distance is less than or equal to 5 nm. It may be understood that, the counter-doped region is located inside the channel region, to serve as an obstacle for the GIDL current between the first doped region and the gate. The axis of the channel region coincides with the axis of the counter-doped region, such that the width of the remaining channel region does not vary greatly. In this way, the passage, through which the carriers pass, in the channel region outside the counter-doped region has the same width, to ensure that the carriers has a constant density when passing through the channel region along the periphery of the counter-doped region. However, in an actual manufacturing process of the semiconductor structure, the axis of the channel region may be deviated from the axis of the counter-doped region. When the axis deviation distance is less than or equal to 5 nm, the impact of the axis deviation between the counter-doped region and the channel region can be reduced as much as possible, to avoid an excessive density difference when the carriers pass through the channel region along the periphery of the counter-doped region since the counter-doped region is too close to the boundary of the channel region, thereby improving the usability of the semiconductor structure.

Further referring to FIG. 2, in some embodiments, a cross-sectional width of the channel region 100 is greater than or equal to 30 nm. For example, an interface width of the channel region 100 may be 30 nm, 40 nm or 60 nm. Because the counter-doped region 200 needs to be arranged in the channel region 100, if the cross-sectional width of the channel region 100 is excessively small, that is, if the diameter of the channel region 100 is excessively small, the counter-doped region 200 cannot be arranged inside the channel region 100, thus affecting the usability of the transistor structure. The cross-sectional width of the channel region 100 is greater than or equal to 30 nm, such that the counter-doped region 200 can be formed in the channel region 100 conveniently. However, as the cross-sectional width of the channel region 100 increases, the volume of the formed transistor structure also increases, resulting in a decrease in the integration density per unit space of the semiconductor structure. Therefore, the cross-sectional width of the channel region 100 needs to be selected and adjusted according to actual conditions. This embodiment does not overly limit the cross-sectional width of the channel region 100.

Further, in some embodiments, a difference between the cross-sectional width of the channel region and the cross-sectional width of the counter-doped region is 10 nm to 20 nm. In other words, the width of the remaining channel region obtained by subtracting the cross-sectional width of the counter-doped region from the cross-sectional width of the channel region is 10 nm to 20 nm. It may be understood that, the counter-doped region serves as an obstacle for the GIDL current in the off-state. In the process of using the transistor structure, the remaining channel region is used as a passage for carriers. If the cross-sectional width of the counter-doped region is excessively large, the cross-sectional width of the channel region is smaller, and the width of the carrier passage in the process of using the transistor, which may affect the usability of the transistor. If the cross-sectional width of the counter-doped region is excessively small, the obstruction effect of the counter-doped region for the GIDL current is reduced, resulting in a decline in the reliability of the semiconductor structure. Therefore, the difference between the cross-sectional width of the channel region and the cross-sectional width of the counter-doped region is required to be within a certain range, to ensure that the performance of the semiconductor structure is not affected while the GIDL current is obstructed.

In the semiconductor structure provided by the embodiment of the present disclosure, the active pillar formed by the channel region as well as the first doped region and the second doped region at two sides of the channel region may be configured to form a structure of a junctionless transistor. The first doped region serves as one of the source or drain of the junctionless transistor, and the second doped region serves the other of the source or drain of the junctionless transistor. Compared with a junction transistor, the junctionless transistor can reduce the steepness of concentration gradient distribution between the channel region and the source or drain, thereby reducing thermal budget. The gate surrounds a part of the channel region, to form a gate-all-around transistor; the area of the channel region is increased to enhance the current control capability of the transistor, thereby improving the usability of the semiconductor structure. Moreover, the gate-all-around structure can increase the space utilization of the semiconductor structure, thereby further increasing the integration density of the semiconductor structure. By arranging the counter-doped region in the channel region, a PN junction can be formed in the channel region. The counter-doped region extends towards the first doped region, to increase the distance between the gate and the first doped region, such that no overlapping area appears between the first doped region and the gate, thereby reducing the intensity of the electric field between the first doped region and the gate. Moreover, the effective current width of the first doped region is also reduced, to reduce the band-to-band tunneling current, thereby reducing the GIDL current between the first doped region and the gate.

Another embodiment of the present disclosure provides a method of manufacturing a semiconductor structure, which can be used to form the foregoing semiconductor structure, to alleviate the problem of GIDL current in the semiconductor structure, thereby improving the reliability of the semiconductor structure. It should be noted that, for parts that are the same as or corresponding to those in the foregoing embodiment, reference may be made to the corresponding description in the foregoing embodiment, and details are not be repeated below.

FIG. 4 to FIG. 9 are schematic structural diagrams corresponding to steps of a method of manufacturing a semiconductor structure according to another embodiment of the present disclosure.

Figure 4:
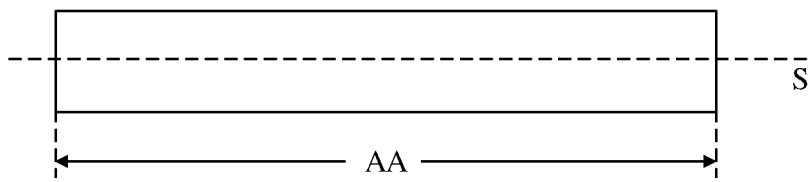
FIG. 4 to FIG. 9 are schematic structural diagrams corresponding to steps of a method of manufacturing a semiconductor structure according to another embodiment of the present disclosure.

Referring to FIG. 4, a base (not shown in the figure) is provided, where the base includes an active pillar AA, and the active pillar AA has a first doping type.

The base may be made of an elemental semiconductor material or a crystalline inorganic compound semiconductor material. The elemental semiconductor material may include silicon or germanium, and the crystalline inorganic compound semiconductor material may include silicon carbide, silicon germanium, gallium arsenide or indium gallium.

The active pillar AA may be made of an elemental semiconductor material or a crystalline inorganic compound semiconductor material. The elemental semiconductor material may include silicon or germanium, and the crystalline inorganic compound semiconductor material may include silicon carbide, silicon germanium, gallium arsenide or indium gallium. In this embodiment, the material of the active pillar AA is the same as that of the base; in other embodiments, the material of the active pillar AA may be different from that of the base.

In some embodiments, the first doping type may be P-type or N-type. N-type dopant ions include phosphorus, arsenic, or antimony ions; and P-type dopant ions include boron, indium, or boron fluoride ions.

Figure 5:
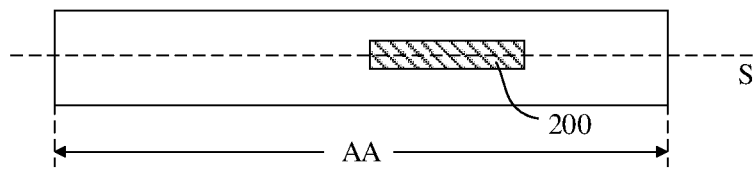

Referring to FIG. 5, a counter-doped region 200 is formed. The counter-doped region 200 is close to an end of the active pillar AA, and a doping type of the counter-doped region 200 is different from that of the active pillar AA.

For the counter-doped region 200, the doping type of the counter-doped region 200 is different from that of the active pillar AA. If the type of dopant ions of the active pillar AA is N-type, the type of dopant ions of the counter-doped region 200 is P-type; if the type of dopant ions of the active pillar AA is P-type, the type of dopant ions of the counter-doped region 200 is N-type.

Figure 6:
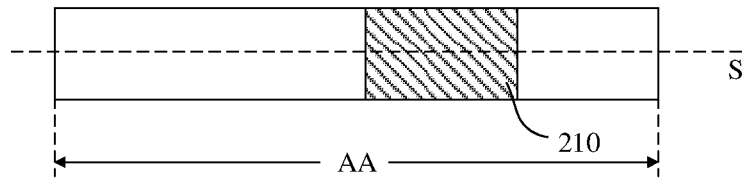
Figure 7:
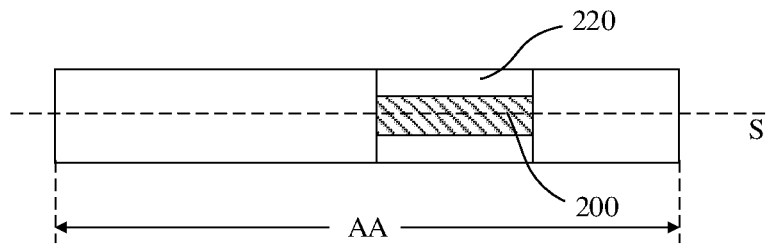

In some embodiments, the forming a counter-doped region includes: referring to FIG. 6, doping a region close to an end of the active pillar AA to form an initial counter-doped region 210; and referring to FIG. 7, doping a surface of the initial counter-doped region 210 to form a surface region 220 having the first doping type, where the remaining initial counter-doped region 210 is used as the counter-doped region 200.

For the initial counter-doped region 210, the doping type of the initial counter-doped region 210 is different from that of the active pillar. If the type of dopant ions of the active pillar AA is N-type, the type of dopant ions of the initial counter-doped region 210 is P-type; if the type of dopant ions of the active pillar AA is P-type, the type of dopant ions of the initial counter-doped region 210 is N-type.

The surface of the initial counter-doped region 210 is doped to form the surface region 220 having the first doping type. That is, if the type of dopant ions of the active pillar AA is P-type, the type of dopant ions for doping the surface of the initial counter-doped region 210 is P-type; if the type of dopant ions of the active pillar AA is N-type, the type of dopant ions for doping the surface of the initial counter-doped region 210 is N-type.

Further, in some embodiments, a doping concentration of the surface region 220 is equal to a doping concentration of the active pillar AA. The active pillar AA around the counter-doped region has the same doping concentration, which can avoid affecting the usability of the semiconductor structure due to a different doping concentration in the channel region outside the counter-doped region after the transistor structure is formed.

In other embodiments, the forming a counter-doped region includes: implanting ions to an internal region close to an end of the active pillar, to directly form the counter-doped region inside the active pillar, thereby forming the semiconductor structure shown in FIG. 4. Energy of ion implantation is adjusted to allow the dopant ions to reach a corresponding depth in the active pillar, so as to directly form the counter-doped region in the active pillar, thereby reducing the manufacturing process of the semiconductor structure and improving the manufacturing efficiency of the semiconductor structure.

Through the foregoing two forming methods of the counter-doped region, a PN junction can be formed in the active pillar, such that in the subsequently formed transistor structure, the source or drain formed close to the counter-doped region has a longer distance from the gate in the middle of the active pillar, to avoid an overlapping area between the source or drain of the transistor and the gate, thereby reducing the intensity of the electrical field between the source or drain and the gate. Moreover, the effective current width of the source or drain is also reduced, thereby reducing the band-to-band tunneling current, and further reducing the GIDL current between the source or drain and the gate.

Figure 8:
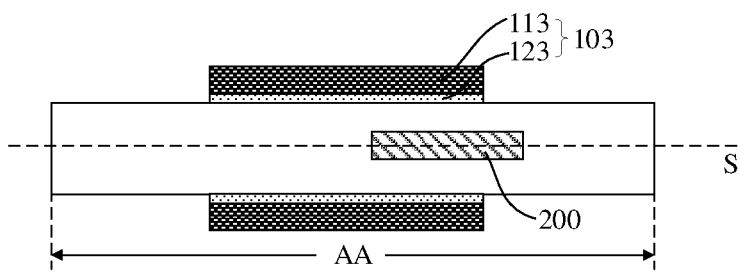

Referring to FIG. 8, a gate 103 is formed, where the gate 103 surrounds partial surface of the active pillar AA, and in a plane in which an axis S of the active pillar AA is located, projection of the gate 103 partially overlaps with projection of the counter-doped region 200.

The gate 103 surrounding a part of the channel region 100 is formed, to form a gate-all-around transistor; the area of the channel region is increased to enhance the current control capability of the transistor, thereby improving the usability of the semiconductor structure. Moreover, the gate-all-around structure can increase the space utilization of the semiconductor structure, thereby further increasing the integration density of the semiconductor structure.

Further referring to FIG. 8, in some embodiments, the step of forming a gate 103 includes: forming a gate dielectric layer 123, where the gate dielectric layer 123 surrounds partial surface of the active pillar AA; and forming a gate conductive layer 113, where the gate conductive layer 113 covers a surface of the gate dielectric layer 123. The gate dielectric layer 123 covers and surrounds partial surface of the channel region 100, and the gate conductive layer 113 covers a surface of the gate dielectric layer 123, to prevent reaction between the gate conductive layer 113 and the active pillar AA in subsequent processes and avoid damaging the semiconductor structure.

The gate dielectric layer 123 is made of at least one from the group consisting of silicon oxide, silicon nitride, or silicon oxynitride.

The gate conductive layer 113 is made of at least one from the group consisting of polysilicon, titanium nitride, titanium aluminide, tantalum nitride, tantalum, copper, aluminum, lanthanum, copper or tungsten.

Figure 9:
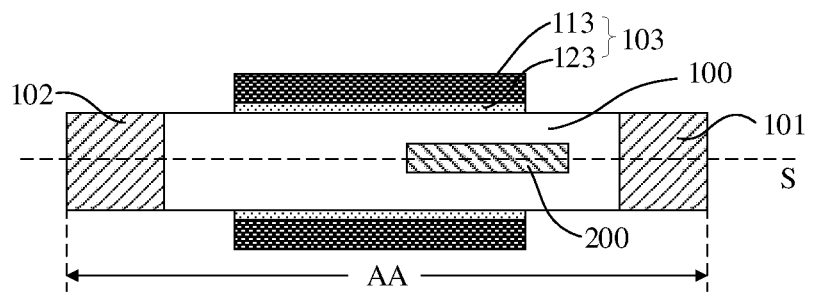

Referring to FIG. 9, heavy ion doping of a first doping type is performed on two end portions of the active pillar AA, to form a first doped region 101 and a second doped region 102. The first doped region 101 is located at a side of the counter-doped region 200 that is away from the gate 103. The first doped region 101 may serve as one of the source or drain of the junctionless transistor, the second doped region 102 may serve as the other of the source or drain of the junctionless transistor, and the remaining active pillar AA between the first doped region 101 and the second doped region 102 serves as the channel region 100, thereby forming the structure of the junctionless transistor. Compared with a junction transistor, the junctionless transistor can reduce the steepness of concentration gradient distribution between the channel region 100 and the source or drain, thereby reducing thermal budget.

It should be noted that, in this embodiment, the first doped region 101 is located at a side of the counter-doped region 200 that is away from the gate 103, that is, the counter-doped region 200 is close to the first doped region 101 in the active pillar AA. In other embodiments, the counter-doped region 200 may be close to the second doped region 102 in the active pillar AA.

In this embodiment, the first doped region 101 is used as the drain of the transistor, and the second doped region 102 is used as the source of the transistor. It should be noted that, the specific connection manner of the "source" and "drain" above does not limit the embodiment of the present disclosure. In other embodiments, a connection manner in which the "source" is replaced with the "drain", and the "drain" is replaced with the "source" may be used.

In some embodiments, the channel region 100 has a doping concentration of $1E^{14}$ cm$^{-3}$ to $1E^{19}$ cm$^{-3}$. For example, the doping concentration of the channel region 100 may be $1E^{14}$ cm$^{-3}$, $1E^{15}$ cm$^{-3}$, $1E^{18}$ cm$^{-3}$ or $1E^{19}$ cm$^{-3}$. The first doped region 101 and the second doped region 102 have a doping concentration of $1E^{19}$ cm$^{-3}$ to $1E^{22}$ cm$^{-3}$. For example, the doping concentration of the first doped region 101 and the second doped region 102 may be $1E^{19}$ cm$^{-3}$, $1E^{20}$ cm$^{-3}$, $1E^{21}$ cm$^{-3}$ or $1E^{22}$ cm$^{-3}$. The counter-doped region 200 has a doping concentration of $1E^{17}$ cm$^{-3}$ to $1E^{19}$ cm$^{-3}$. For example, the doping concentration of the counter-doped region 200 may be $1E^{17}$ cm$^{-3}$, $1E^{18}$ cm$^{-3}$ or $1E^{19}$ cm$^{-3}$. The first doped region 101 and the second doped region 102 are heavily doped, and the channel region 100 is lightly doped, which can reduce the steepness of the concentration gradient distribution between the channel region 100 and the first doped region 101 as well as the second doped region 102, thereby reducing the thermal budget; by doping the counter-doped region with a medium concentration, a PN junction can be formed in the channel region 100, such that the GIDL current between the gate 103 and the first doped region 101 cannot pass through the counter-doped region 200, thereby reducing the GIDL current of the transistor in the off-state and improving the reliability of the semiconductor structure.

In the method of manufacturing a semiconductor structure provided by the embodiment of the present disclosure, the active pillar formed by the channel region as well as the first doped region and the second doped region at two sides of the channel region may be configured to form a structure of a junctionless transistor. The first doped region serves as one of the source or drain of the junctionless transistor, and the second doped region serves the other of the source or drain of the junctionless transistor. Compared with a junction transistor, the junctionless transistor can reduce the steepness of concentration gradient distribution between the channel region and the source or drain, thereby reducing thermal budget. The gate surrounds a part of the channel region, to form a gate-all-around transistor; the area of the channel region is increased to enhance the current control capability of the transistor, thereby improving the usability of the semiconductor structure. Moreover, the gate-all-around structure can increase the space utilization of the semiconductor structure, thereby further increasing the integration density of the semiconductor structure. By arranging the counter-doped region in the channel region, a PN junction can be formed in the channel region. The counter-doped region extends towards the first doped region, to increase the distance between the gate and the first doped region, such that no overlapping area appears between the first doped region and the gate, thereby reducing the intensity of the electric field between the first doped region and the gate. Moreover, the effective current width of the first doped region is also reduced, to reduce the band-to-band tunneling current, thereby reducing the GIDL current between the first doped region and the gate.

Those of ordinary skill in the art can understand that the above implementations are specific embodiments for implementing the present disclosure. In practical applications, various changes may be made to the above embodiments in terms of forms and details without departing from the spirit and scope of the present disclosure.

The invention claimed is:

1. A semiconductor structure, comprising:
    an active pillar, wherein the active pillar comprises: a channel region, as well as a first doped region and a second doped region located at two sides of the channel region, the channel region, the first doped region, and the second doped region having a same doping type;
    wherein a counter-doped region is arranged in the channel region, the counter-doped region is close to the first doped region, and a doping type of the counter-doped region is different from a doping type of the channel region; and
    a gate, wherein the gate surrounds a part of the channel region, and in a plane in which an axis of the active pillar is located, projection of the gate partially overlaps with projection of the counter-doped region;
    wherein a cross-sectional width of the channel region is greater than or equal to 30 nm;
    wherein a difference between the cross-sectional width of the channel region and a cross-sectional width of the counter-doped region is 10 nm to 20 nm.

2. The semiconductor structure according to claim 1, wherein the channel region has a doping concentration of $1E^{14}$ cm$^{-3}$ to $1E^{19}$ cm$^{-3}$, the first doped region and the second doped region have a doping concentration of $1E^{19}$ cm$^{-3}$ to $1E^{22}$ cm$^{-3}$, and the counter-doped region has a doping concentration of $1E^{17}$ cm$^{-3}$ to $1E^{19}$ cm$^{-3}$.

3. The semiconductor structure according to claim 1, wherein the active pillar is cylindrical, ellipsoidal or prismatic, and a cross-sectional shape of the counter-doped region is the same as a cross-sectional shape of the active pillar.

4. The semiconductor structure according to claim 1, wherein an axis of the channel region overlaps with an axis of the counter-doped region.

5. The semiconductor structure according to claim 1, wherein an axis of the channel region is deviated from an axis of the counter-doped region, and an axis deviation distance is less than or equal to 5 nm.

6. The semiconductor structure according to claim 1, wherein the counter-doped region comprises a first inversion region and a second inversion region connected to each other; and in the plane in which the axis of the active pillar is located, projection of the first inversion region is located within the projection of the gate, and projection of the second inversion region is adjacent to the projection of the gate.

7. The semiconductor structure according to claim 6, wherein in an axial direction of the active pillar, a length of the gate is 60% to 80% of a length of the channel region, and a length of the first inversion region is 20% to 60% of the length of the gate.

8. The semiconductor structure according to claim 7, wherein in the axial direction of the active pillar, a length of the second inversion region is 20% to 60% of a distance between the gate and the first doped region.

9. A method of manufacturing a semiconductor structure, comprising:
    providing a base, wherein the base comprises an active pillar, and the active pillar has a first doping type;
    forming a counter-doped region, wherein the counter-doped region is located in the active pillar and is close to an end of the active pillar, and a doping type of the counter-doped region is different from a doping type of the active pillar;

forming a gate, wherein the gate surrounds partial surface of the active pillar, and in a plane in which an axis of the active pillar is located, projection of the gate partially overlaps with projection of the counter-doped region; and performing heavy ion doping of a first doping type on two end portions of the active pillar, to form a first doped region and a second doped region;

wherein the first doped region is located at a side of the counter-doped region that is away from the gate, and the remaining active pillar between the first doped region and the second doped region is used as a channel region;

wherein a cross-sectional width of the channel region is greater than or equal to 30 nm;

wherein a difference between the cross-sectional width of the channel region and a cross-sectional width of the counter-doped region is 10 nm to 20 nm.

10. The method of manufacturing the semiconductor structure according to claim 9, wherein the forming a counter-doped region comprises: doping a region close to an end of the active pillar to form an initial counter-doped region; and doping a surface of the initial counter-doped region to form a surface region having the first doping type, wherein the remaining initial counter-doped region is used as the counter-doped region.

11. The method of manufacturing the semiconductor structure according to claim 10, wherein a doping concentration of the surface region is equal to a doping concentration of the channel region.

12. The method of manufacturing the semiconductor structure according to claim 9, wherein the forming a counter-doped region comprises: implanting ions to an internal region close to an end of the active pillar, to directly form the counter-doped region inside the active pillar.

* * * * *